(12) United States Patent
Yakimets et al.

(10) Patent No.: US 10,957,575 B2
(45) Date of Patent: Mar. 23, 2021

(54) METHOD FOR CONNECTING A BURIED INTERCONNECT RAIL AND A SEMICONDUCTOR FIN IN AN INTEGRATED CIRCUIT CHIP

(71) Applicant: IMEC vzw, Leuven (BE)

(72) Inventors: Dmitry Yakimets, Leuven (BE); Anshul Gupta, Leuven (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/718,624

(22) Filed: Dec. 18, 2019

(65) Prior Publication Data

US 2020/0203210 A1 Jun. 25, 2020

(30) Foreign Application Priority Data

Dec. 20, 2018 (EP) .................................. 18214360

(51) Int. Cl.
*H01L 21/70* (2006.01)
*H01L 21/74* (2006.01)
*H01L 21/311* (2006.01)
*H01L 21/48* (2006.01)
*H01L 21/768* (2006.01)
(Continued)

(52) U.S. Cl.
CPC ...... *H01L 21/743* (2013.01); *H01L 21/31144* (2013.01); *H01L 21/481* (2013.01); *H01L 21/76895* (2013.01); *H01L 21/76898* (2013.01); *H01L 23/3107* (2013.01); *H01L 23/528* (2013.01); *H01L 23/535* (2013.01)

(58) Field of Classification Search
CPC ............. H01L 21/743; H01L 21/31144; H01L 21/481; H01L 21/76895; H01L 21/76898; H01L 23/3107; H01L 23/528; H01L 23/535; H01L 21/76897; H01L 23/5286; H01L 29/41791; H01L 21/823431; H01L 21/823475
See application file for complete search history.

(56) References Cited

U.S. PATENT DOCUMENTS 7,932,187 B2  4/2011 Kobayashi
8,748,261 B2  6/2014 Takehara
(Continued)

FOREIGN PATENT DOCUMENTS

CN  108155233     6/2018
EP  3 324 436 A1  5/2018
WO  WO 2017/052630 A1  3/2017

OTHER PUBLICATIONS

Extended European Search Report dated Jul. 2, 2019 in EP Application No. 18214360.2.

*Primary Examiner* — Robert G Bachner
(74) *Attorney, Agent, or Firm* — Knobbe Martens Olson & Bear LLP (57) ABSTRACT

An integrated circuit chip having fin-based active devices in the front end of line, and an electrical connection between a buried interconnect rail and a contact area on a semiconductor fin, such as an epitaxially grown source or drain contact area of a transistor, is disclosed. In one aspect, the electrical connection is realized without the intervention of a metallization level formed above the active devices in the IC. Instead, an interconnect via is produced between the buried interconnect rail and a lateral portion of the contact area, wherein the lateral portion is directly contacted by a sidewall of the interconnect via. Methods for producing the interconnect via are also disclosed.

7 Claims, 9 Drawing Sheets

(51) Int. Cl.
    *H01L 23/31*        (2006.01)
    *H01L 23/528*      (2006.01)
    *H01L 23/535*      (2006.01)

(56) References Cited

U.S. PATENT DOCUMENTS

| | | |
|---|---|---|
| 9,324,842 B2 | 4/2016 | Zang et al. |
| 2009/0001440 A1 | 1/2009 | Wei et al. |
| 2018/0026042 A1 | 1/2018 | Smith et al. |
| 2018/0158942 A1 | 6/2018 | Shibib et al. |
| 2018/0294267 A1 | 10/2018 | Licausi et al. |

METHOD FOR CONNECTING A BURIED INTERCONNECT RAIL AND A SEMICONDUCTOR FIN IN AN INTEGRATED CIRCUIT CHIP

CROSS-REFERENCE TO RELATED APPLICATIONS

This application claims foreign priority to European Patent Application No. 18214360.2, filed Dec. 20, 2018, the contents of which are incorporated by reference herein in its entirety.

BACKGROUND

Technological Field

The disclosed technology is related to semiconductor processing, in particular to the production of fin-based active devices on an integrated circuit chip.

Description of the Related Technology

Fin-based active devices, primarily transistors, are extensively applied for the production of standard cells and other active device configurations processed in the front end of line (FEOL) part of the integrated circuit fabrication process, and include finFETs, as well as more recent devices based on nano-wires or nano-sheets. An example technology involves the use of buried interconnect rails in the front end of line. European Publication No. EP3324436A1 describes the production of buried power rails, for directly connecting the transistors in the FEOL to a power delivery network located entirely on the back side of an integrated circuit chip. In particular, the source or drain area of a number of transistors are directly connected to a buried rail. The current practice for realizing this configuration is to produce an interconnect via to the buried rail, and to couple the interconnect via to the source or drain area through a local interconnect that is part of the M0 metallization level of the chip, also referred to as the "middle end of line," which is a transition between the active devices in the front end of line, and the interconnect levels (M1, M2 etc.,) in the back end of line (BEOL).

Some implementations of this approach have a number of drawbacks. As the rails are buried underneath the active devices, the vias are necessarily deep and narrow, which increases the resistivity of these connections, thereby negatively influencing device performance. Increasing the width of the vias is restricted because of lithography constraints in the M0 level. The use of local interconnects for connecting a transistor to a buried rail also leads to increased parasitic capacitance between the local interconnect and the gate of the transistor.

SUMMARY OF CERTAIN INVENTIVE ASPECTS

The disclosed technology provides a method for connecting a contact area formed on a semiconductor fin to a buried rail, that does not suffer from the above-described disadvantages. This aim is achieved by in an integrated circuit chip and by a method in accordance with the disclosed technology. The disclosed technology is generally related to an integrated circuit chip having fin-based active devices in the front end of line, and to the electrical connection between a contact area on a semiconductor fin, such as an epitaxially grown source or drain contact area of a transistor, and a buried interconnect rail. According to the disclosed technology, the connection is realized without the intervention of a metallization level formed above the active devices in the IC. Instead, an interconnect via is produced between the rail and a lateral portion of the contact area, wherein the lateral portion is directly contacted by a sidewall of the via. The disclosed technology is equally related to a method for producing the interconnect via.

The disclosed technology is in particular related to an integrated circuit chip including a front end of line portion that includes one or more buried interconnect rails and at least one fin-based active device including a contact area in direct contact with a top portion of a semiconductor fin, the top portion extending above a first dielectric layer present on the substrate, the buried rail being located adjacent to the fin, wherein the contact area is embedded in a further dielectric layer, hereafter referred to as the ILD0 layer, that is present on top of the first dielectric layer, and wherein the contact area is electrically connected to the buried rail through an interconnect via that is in contact with the buried rail and that extends at least partially above the rail, characterized in that:

an upper region of a sidewall of the interconnect via is in contact with a lateral portion of the contact area, thereby realizing the electrical connection between the interconnect via and the contact area, and the interconnect via is covered by the ILD0 layer.

According to an embodiment, the contact area is a wrap-around contact area of which the sidewalls are essentially parallel to the central longitudinal plane of the fin, and wherein the upper region of the sidewall of the interconnect via is in contact with a sidewall of the contact area.

According to another embodiment, the sidewalls of the contact area are not parallel to the central longitudinal plane of the fin. For example, the contact area may be a diamond-shaped contact area.

The disclosed technology is furthermore related to a method for producing an electrical connection between a buried interconnect rail and a contact area of an integrated circuit chip including a front end of line portion that includes one or more buried interconnect rails and at least one fin-based active device including the contact area in direct contact with a top portion of a semiconductor fin, that is uniform with or built on a semiconductor substrate, the top portion of the fin extending above a first dielectric layer present on the substrate, the buried rail being buried in the substrate and in the first dielectric layer, and the buried rail being located adjacent to the fin, the method including:

providing the fin, the first dielectric layer, the buried rail, and the active device including the contact area on the semiconductor substrate, depositing a layer of dielectric material, hereafter referred to as a partial ILD0 layer, on top of the first dielectric layer, and embedding the contact area in the partial ILD0 layer, producing a mask on top of the partial ILD0 layer, the mask having an opening at least partially overlapping the rail and the contact area, anisotropically etching the material of the partial ILD0 layer and subsequently etching the material of the first dielectric layer in the location defined by the opening, the etch process being self-aligned relative to a lateral portion of the contact area, to thereby create a cavity, the etch process being continued at least until exposing at least the top surface of the buried rail, in the cavity, providing an interconnect via formed above and in direct contact with the rail, wherein an upper region of a sidewall of the interconnect via is in direct contact with a lateral portion of the contact area, thereby realizing the electrical connection between the interconnect via and the contact area, removing the mask, and depositing a further layer of dielectric material, covering the interconnect via, and forming, together with the partial ILD0 layer, a final ILD0 layer.

According to an embodiment of a method of the disclosed technology, the interconnect via is obtained in the cavity by:

filling the cavity with an electrically conductive material, and performing a recess etch of the electrically conductive material in the cavity.

In a method of the disclosed technology, the contact area may be a wrap-around contact area of which the sidewalls are essentially parallel to the central longitudinal plane of the fin, and wherein the upper region of the sidewall of the interconnect via is essentially parallel to and in contact with a sidewall of the contact area. Alternatively, the contact area may have sidewalls which are not parallel to the central longitudinal plane of the fin. For example, the contact area may be a diamond-shaped contact area.

DETAILED DESCRIPTION OF CERTAIN ILLUSTRATIVE EMBODIMENTS

Figure 1A:
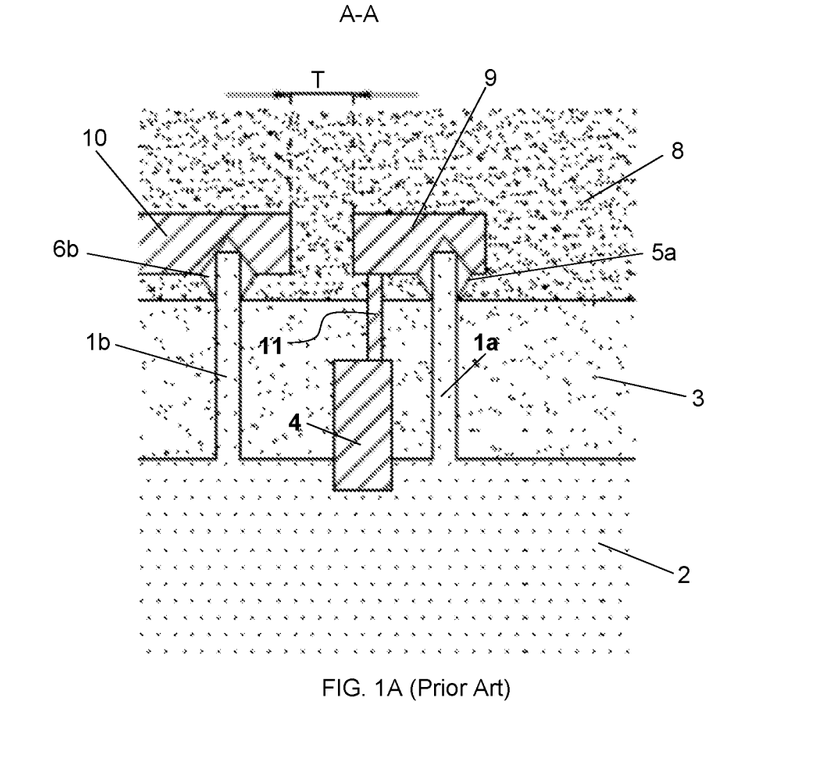
FIGS. 1A and 1B show a section view and a top view of a fin-based transistor according to the prior art.
Figure 1B:
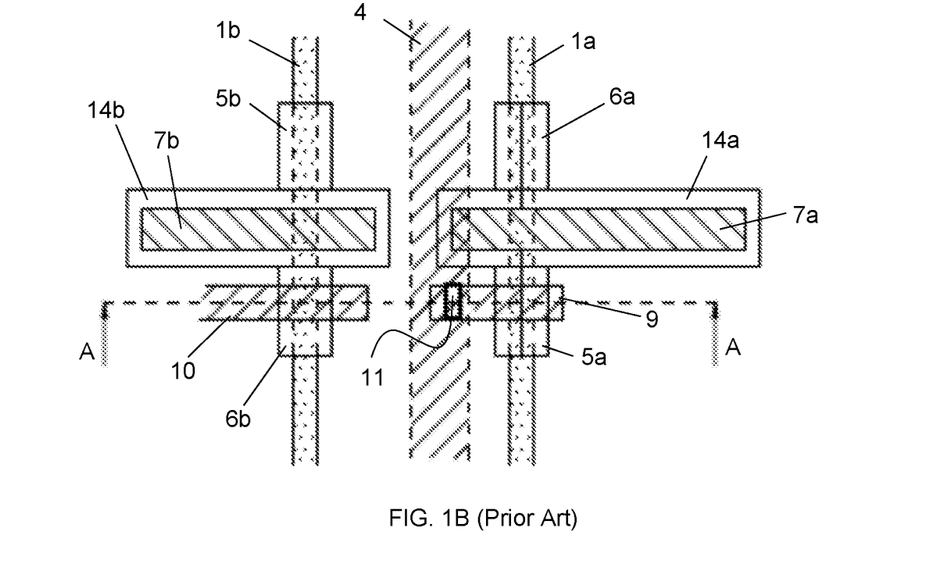

Before describing the disclosed technology, a prior art configuration referred to above will be looked at in more detail. FIGS. 1A and 1B illustrate such a configuration for connecting a buried rail to the source area of a fin-based transistor. Two parallel fins 1a and 1b are formed on a semiconductor substrate 2, usually a silicon substrate. The fins may be built on or uniform with the substrate, and formed in one or several well portions of the substrate (not shown), which area p or n doped areas consistent with the device layout of an integrated circuit chip. A base portion of the fins 1 is embedded in a dielectric layer, typically silicon dioxide, generally referred to as the shallow trench isolation (STI) layer 3. A power rail 4 is buried in the substrate 2 and in the STI layer 3. Possibly a dielectric liner (not shown) separates the buried rail 4 from the semiconductor material of the substrate 2. On each of the fins 1a and 1b a transistor is built comprising epitaxially grown source and drain contact areas 5a and 6a on the first fin 1a and 5b and 6b on the second fin 1b. The contact areas are formed over selected portions of the fins 1a and 1b, and are typically silicon germanium (SiGe), SiC or doped Si, depending on whether the transistor is a p-type or an n-type device. Gate electrodes 7a and 7b are transversally arranged on the fins 1a and 1b respectively, between the source and drain areas, and spacers 14a and 14b respectively separate the gate electrodes 7a and 7b from the source and drain areas. In the embodiment shown, the contact areas 5a/6a and 5b/6b have sidewalls which are not parallel to the fins. The contact areas are diamond-shaped, referring to the shape that is obtained in accordance with the crystallographic planes of the semiconductor material of the fins and of the epitaxially grown material of the areas 5a/6a and 5b/6b. On top of the STI layer 3 is a further dielectric layer 8, commonly referred to as the pre-metal dielectric layer (PMD) or the interlayer dielectric "zero" layer (ILD0). Hereafter the term ILD0 layer will be used. Embedded in the ILD0 layer 8 is the M0 metallization level, including local interconnects 9 and 10 formed of metal such as cobalt, ruthenium or tungsten. The drain 6b of the second transistor, built on the second fin 1b, is connected to the local interconnect 10. The source 5a of the first transistor is connected to the buried power rail 4. The latter connection is realized by a narrow metal-filled via 11, and by the local interconnect 9. Some disadvantages of this configuration are as described above. The distance T represents the tip-to-tip lithography constraint for conductors in the M0 level, i.e., two conductors in the same plane and produced in a single lithography step cannot be closer to each other than this distance T. This constraint necessitates the use of the deep and narrow interconnect via 11, placed close to the fin 1a, for realizing a connection between the buried rail 4 and the local interconnect 9.

Figure 2A:
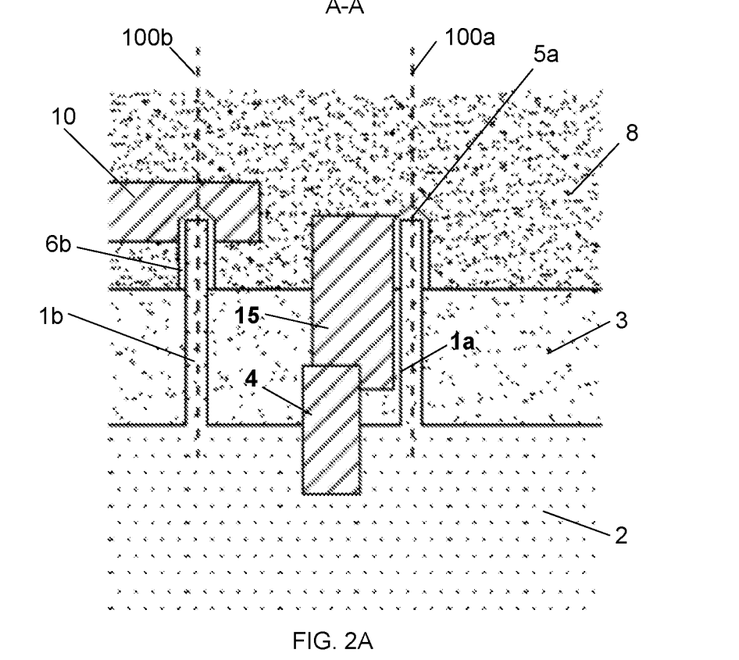
FIGS. 2A and 2B show a section view and a top view of a fin-based transistor according to the disclosed technology.
Figure 2B:
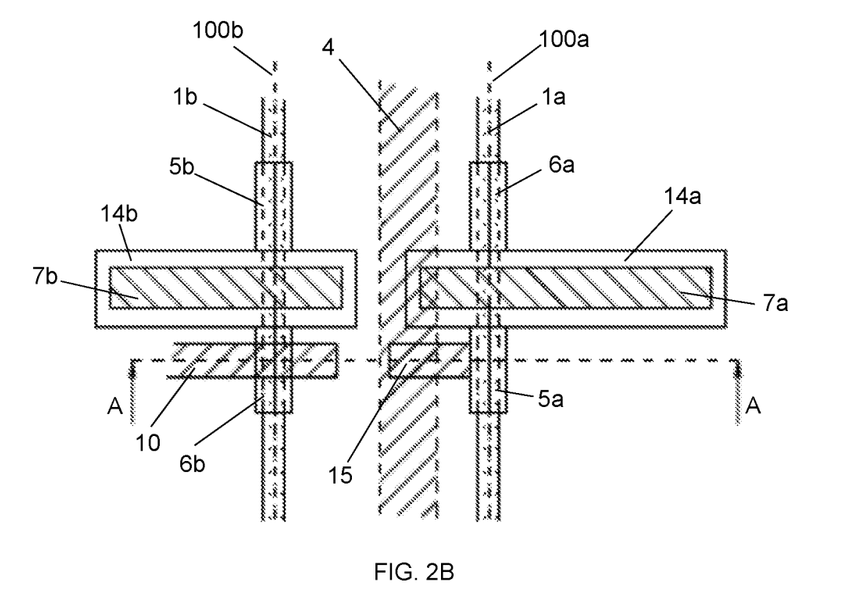

FIGS. 2A and 2B represent a configuration according to the disclosed technology. The substrate 2, the fins 1a and 1b, the buried rail 4, the STI layer 3, the gate electrodes 7a and 7b, the spacers 14a and 14b, one of the local interconnects 10 and the ILD0 layer 8 are all indicated by the same numerical references as in FIGS. 1A and 1B. Instead of the diamond-shaped contact areas 5a/6a and 5b/6b in FIGS. 1A and 1B, the epitaxially grown contact areas indicated by these same numerical references are now so-called wrap-around contacts (WAC). This type of contact can be implemented in any suitable manner, for example it can be obtained by epitaxially growing the contact material in an area confined by lateral spacers, which are removed after the epitaxial growth. The crystallographic planes still dictate the growth, but this results only in the illustrated triangular portion at the top of the contact areas. Along the sides of the fin however, the sidewalls of the contact areas are essentially parallel to the central vertical and longitudinal planes 100a and 100b of the fins 1a and 1b. Even though the disclosed technology is not limited to this particular contact area shape, this shape is suited for the configuration according to the disclosed technology, which includes an interconnect via 15 between the buried rail 4 and the source contact area 5a on the first fin 1a. The interconnect via 15 is laterally connected to the source contact area 5a, i.e., an upper region of a sidewall of the interconnect via 15 is in direct contact with a lateral portion of the source contact area 5a, thereby realizing the electrical connection between the interconnect via 15 and the source contact area 5a. The ILD0 layer 8 covers the top of the interconnect via 15, implying that there is no connection between the interconnect via 15 and the M0 metallization level. In other words, the lateral interconnect via 15 is the only connection between the rail 4 and the source contact area 5a. This connection requires no participation from a local interconnect situated in the M0 metallization level. The local interconnect 10 is again connected to the drain contact area 6b of the second transistor, in the same way as in the prior art configuration.

The disclosed technology is relevant to any type of fin-based active device. For example, the transistor shown in FIGS. 2A and 2B may be a finFET transistor, or a nanosheet-based or nanowire-based transistor.

The advantages of the disclosed technology are substantive. The lithography constraint is less stringent, as the interconnect via 15 and the local interconnect 10 are not produced in the same lithography step (see further details in an example implementation below). The cross-section of the interconnect via 15 can therefore be larger than the deep and narrow via 11 in the prior art case, leading to a decreased resistivity of the path between the buried rail 4 and the contact area 5a. This contact path does not include any conductors in the M0 metallization layer, thereby alleviating the concerns about parasitic capacitances.

Figure 3A:
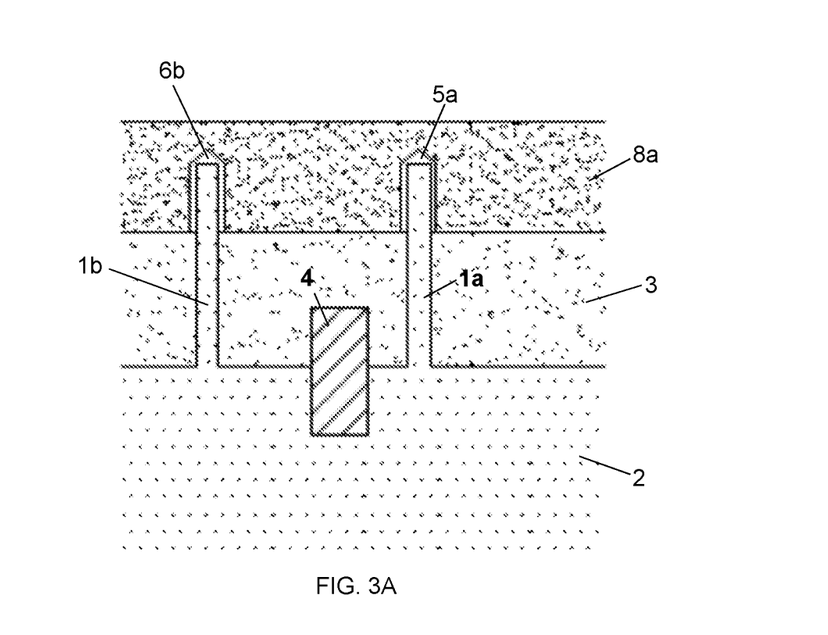
FIGS. 3A to 3G illustrate a possible process for producing a lateral interconnect via in accordance with the disclosed technology.
Figure 3B:
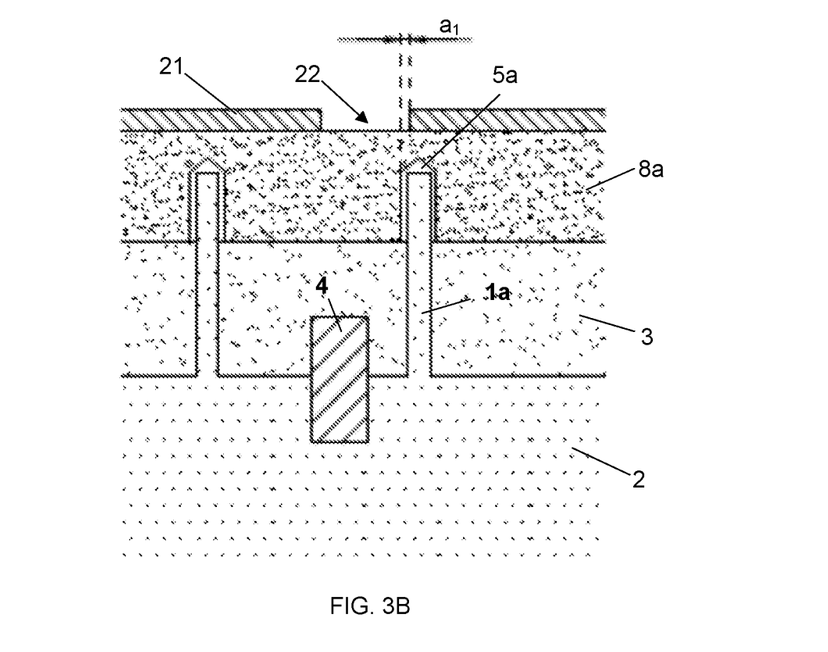
Figure 3C:
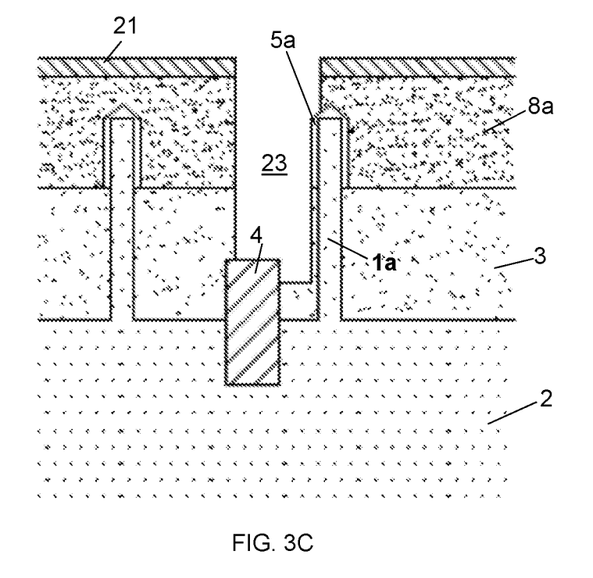
Figure 3D:
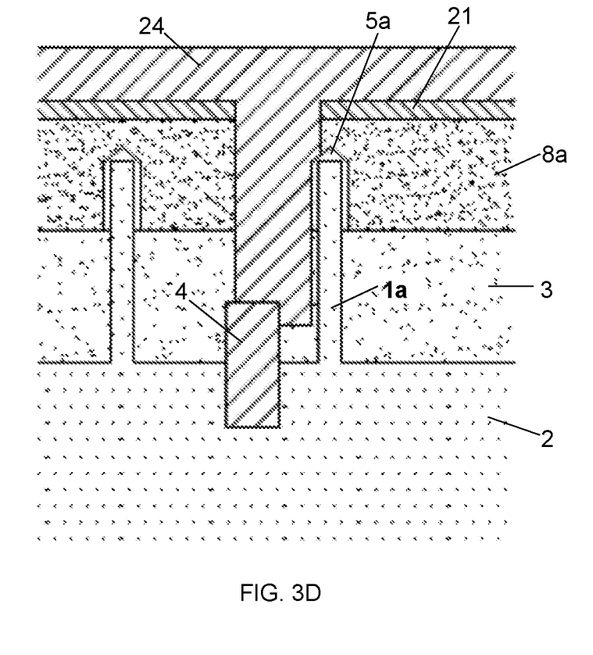
Figure 3E:
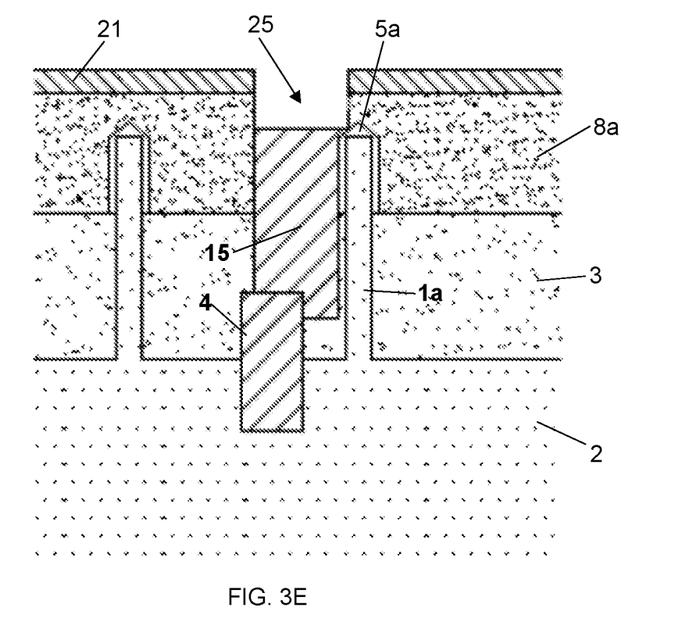
Figure 3F:
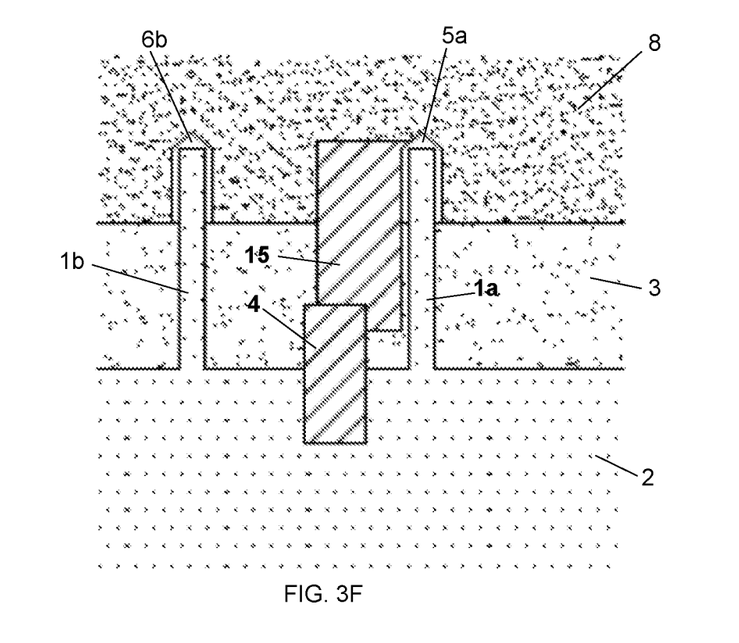
Figure 3G:
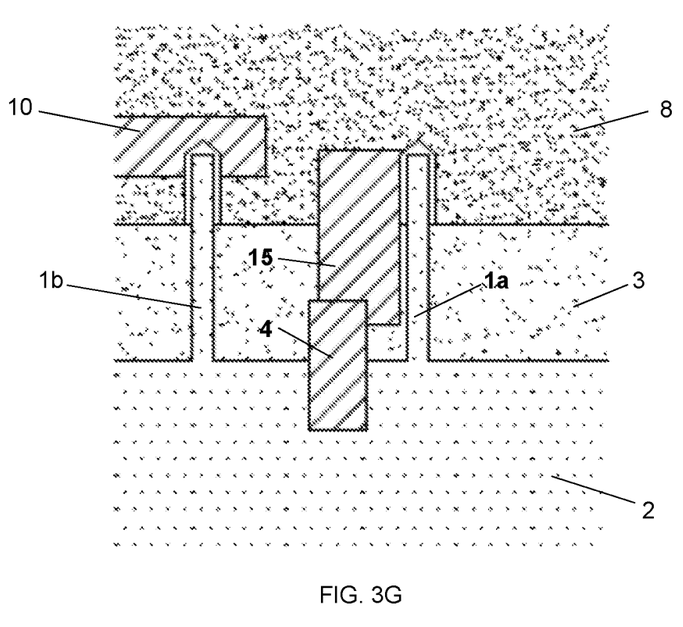

A possible production process for realizing the configuration shown in FIGS. 2A and 2B is illustrated in FIGS. 3A to 3G. FIG. 3A shows a section view through the source contact area 5a on the first fin 1a and the drain contact area 6b on the second fin 6b, at a particular stage in the standard production process for producing the transistors. The process is applied at wafer level, i.e., on a silicon wafer containing a plurality of IC chips processed simultaneously, each chip containing multiple active devices, such as the transistors shown in the drawings. At the process stage shown in FIG. 3A, the buried rail 4 is in place, processed for example in accordance with the method described in European Publication No. EP3324436A1. Also, the wrap-around contact areas 5a/6a and 5b/6b are in place, and the gate electrodes 7a and 7b have been produced, optionally using the well-known metal gate replacement technique. A first layer 8a of ILD0 material has been deposited on the wafer, covering the gate electrodes and the source and drain contact areas. Layer 8a is hereafter referred to as a "partial ILD0 layer." On the planarized upper surface of the partial ILD0 layer 8a, a mask 21 is produced, as shown in FIG. 3B. The mask exhibits an opening 22 that exposes an area adjacent to the source contact area 5a, overlapping the area over a given overlap distance al, as illustrated in FIG. 3B. An anisotropic etch process is then performed (see FIG. 3C), optionally a plasma-based dry etch, for removing the ILD0 material and the underlying STI material anisotropically in the area defined by the mask opening 22. The etch process is selective to the material of the source contact area 5a. Therefore, this material is not removed by the etch process, and the etch process is self-aligned to the side wall of the contact area 5a. The etching continues, reaching the buried rail 4 and slightly overetching the STI material beyond the buried rail, thereby creating a cavity 23 in the partial ILD0 layer 8a and in the STI layer 3. Then (as shown in FIG. 3D), the cavity 23 is filled with an electrically conductive material, preferably a metal 24, which may form a layer on the upper surface of the mask 21. The metal layer 24 is then planarized and the metal in the cavity 23 is recessed by a suitable etch process, until reaching the source contact area 5a, thereby creating the interconnect via 15 and a recess 25 above it, as seen in FIG. 3E. Alternatively, the material of the interconnect via 15 may be deposited only on the exposed rail 4 by selective deposition, so that no etch-back is required. Then the mask 21 is removed and additional ILD0 material is deposited on the wafer, filling the recess 25 (see FIG. 3F) and forming a final ILD0 layer 8 on the wafer. Alternatively, the mask 21 could be removed prior to depositing the metal 24. Further processing steps include patterning the ILD0 layer 8 for producing the M0 metallization therein, including the local interconnect 10 to the drain area 6b on the second fin 1b (see FIG. 3G), and completing the production process of the IC by additional steps according to any suitable implementation and not described here in further detail. It is seen thereby that the interconnect via 15 and the local interconnect 10 are not patterned in the same lithography step.

Figure 4A:
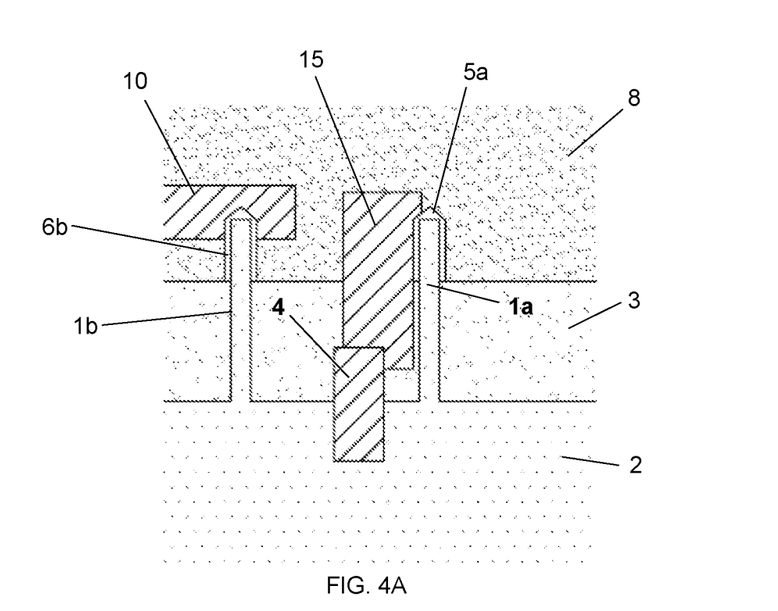
FIGS. 4A and 4B illustrate alternative versions of the lateral interconnect via.
Figure 4B:
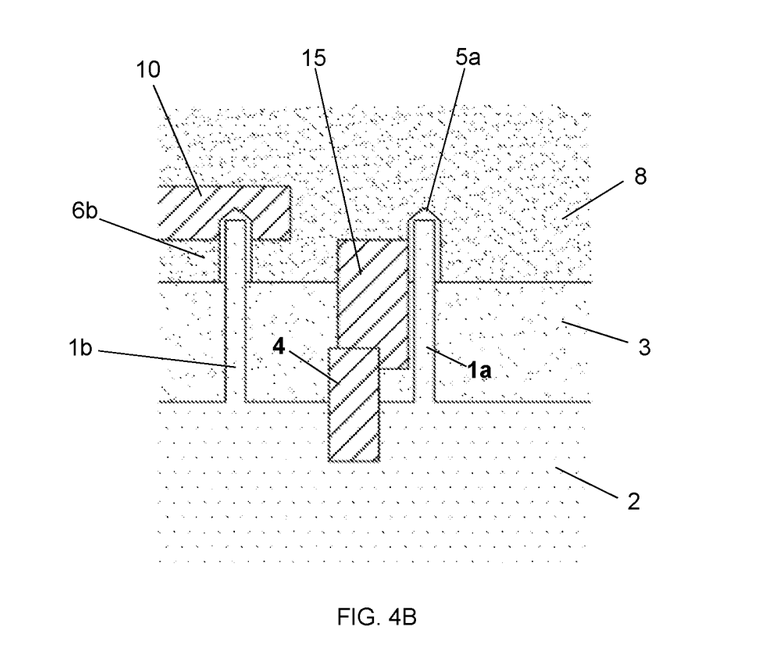

Some steps may deviate slightly from the above. The recess etch of the metal 24 may be stopped prior to reaching the source contact area 5a, leading to a result as shown in FIG. 4A: the interconnect via 15 extends above the source contact area 5a. If the source contact area 5a is resistant to the etch process used for the recess etch, this recess etch of the metal may be continued beyond the source contact area 5a, leading to a result as shown in FIG. 4B, wherein the interconnect via 15 contacts only a portion of the side wall of the wrap-around source contact area 5a.

If the wrap-around contact material is not resistant to the etch process for producing the first cavity 23, a dielectric liner may be first deposited conformally on the wrap-around source contact area 5a prior to depositing the ILD0 material thereon. The liner is resistant to the etch process for producing the first cavity 23. In this way, the source contact area 5a is protected during etching of the first cavity 23. The liner must then be removed prior to depositing the metal 24 in the first cavity 23.

Figure 5:
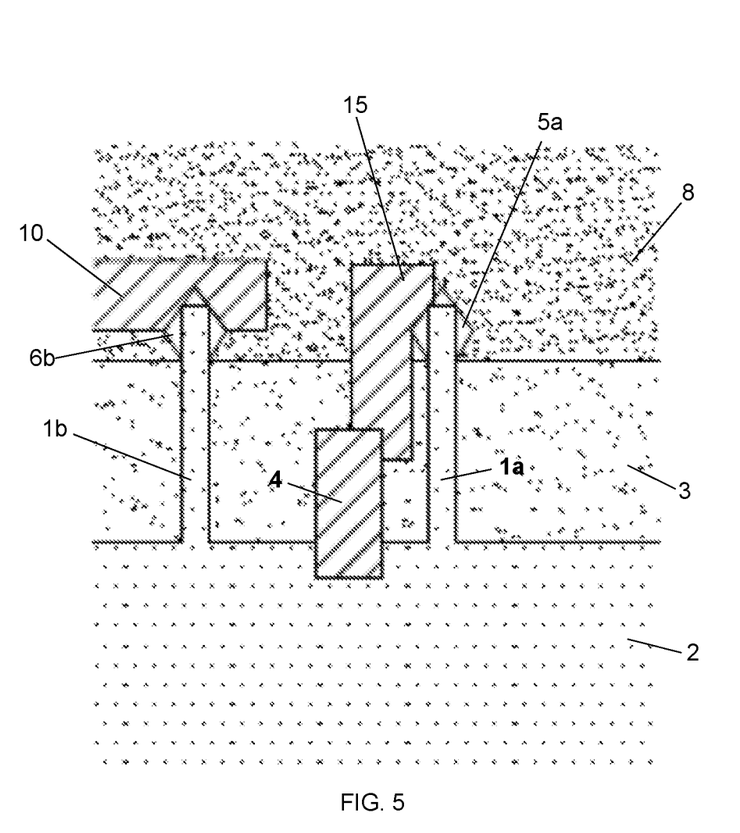
FIG. 5 illustrates a configuration including a lateral interconnect via that connects a buried rail to a diamond shaped contact area on the semiconductor fin.

The disclosed technology may be applied also to other shapes of epitaxial contact areas, such as the diamond shape illustrated in FIG. 1, but also to other shapes which have sidewalls which are not parallel to the central longitudinal plane of the fin. FIG. 5 shows the result of a method of the disclosed technology applied to the diamond-shaped contact area of FIG. 1. The direct contact between the interconnect via 15 and the diamond-shaped source contact area 5a extends over a smaller surface compared to the case of the wrap-around contact, which makes this non-limiting implementation less ideal in the case of the diamond-shaped area. The disclosed technology is, however, also applicable in this case.

Figure 6A:
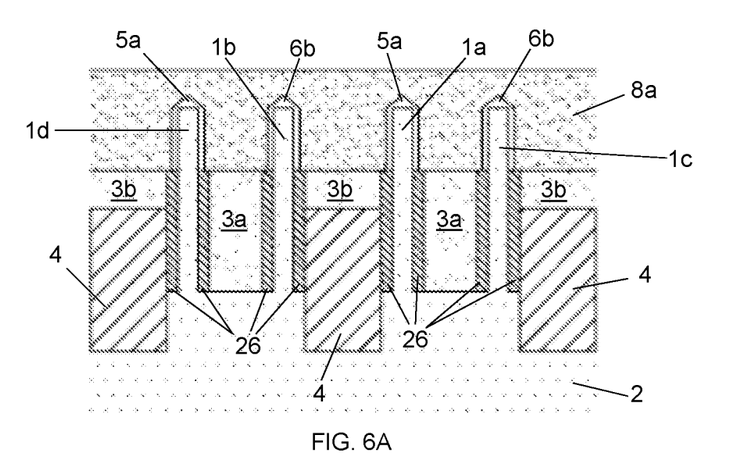
FIGS. 6A to 6C illustrate a configuration according to the disclosed technology, wherein buried interconnect rails are self-aligned to the space between adjacent fins.
Figure 6B:
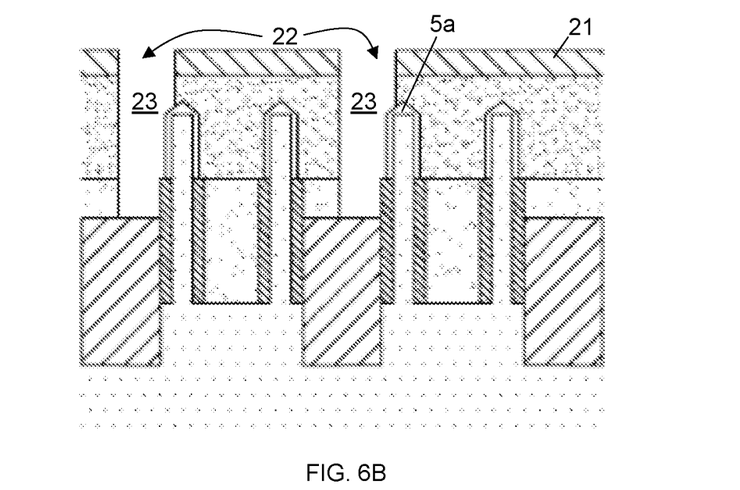
Figure 6C:
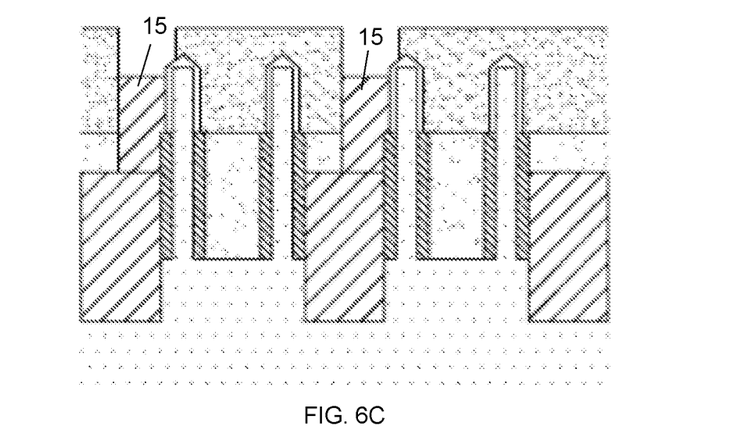

The disclosed technology is also applicable to embodiments wherein buried power rails are self-aligned relative to two adjacent fins. This embodiment is illustrated in FIGS. 6A to 6C. FIG. 6A illustrates the stage in a method according to the disclosed technology, as applied to this embodiment, just before the fabrication of the lateral interconnect via 15. Four adjacent fins are shown. The two central fins are again numbered 1a and 1b, in equivalence to the previous embodiments. Two additional fins 1c and 1d on either side of the central pair are equally visible. Self-aligned buried power rails 4 are present between the central fins 1a and 1b and on either side of the lateral fins 1c and 1d. Further fins may be present on either side of these fins but these further fins are not shown in the drawing. The production of self-aligned buried rails can be implemented using any suitable technique. As illustrated in the FIG. 6A, it requires a liner 26 on the sidewalls of the fins, for example a layer of silicon nitride. The liner acts as a self-aligning mask for etching the trenches in an STI layer 3a deposited initially on the totality of the fins and etched back to reveal the upper portion of the fins. The material of the rails is deposited in these trenches, and etched back, and the liner 26 is equally removed down to the upper surface of the final rails 4. As a result, the buried rails 4 are self-aligned to the space between two adjacent fins, and the liner 26 remains between the rails 4 and the fins. On top of the rails 4, further dielectric material 3b is deposited and etched back to reveal the active portion of the fins, followed by the production of the source and drain contact areas 5a/6a and 5b/6b and the gate as described above. In this case, the combined dielectric portions 3a and 3b are equivalent to the STI layer 3 in the previous embodiment. Like the STI layer 3, these dielectric portions 3a and 3b are an embodiment of the "first dielectric layer" cited in the appended claims. Here also, the partial ILD0 layer 8a is deposited prior to forming the lateral interconnect vias 15 in accordance with the disclosed technology.

This fabrication of lateral interconnect vias 15 takes place in the same way as described for the previous embodiments, as seen in FIGS. 6B and 6C. A mask 21 is applied, defining an opening that overlaps the source contact area 5a, and the cavity 23 is etched. The etch process needs to be selective with respect to the material of the liner 26, i.e., the liner is not etched by this etch process, so that in this case, the etch process stops when the upper surface of the buried rail 4 is reached. In other words, there can be no overetch in this case, which leads to a better controlled process. After filling the cavity 23, the interconnect via 15 is again obtained (two interconnect vias in the case shown), and the remainder of the process may be executed, including the production of additional ILD0 material and the formation of the M0 level, as described for the previous embodiments.

The disclosed technology is not limited to the above-described embodiments wherein a source contact area 5a of a transistor is coupled directly to a buried rail 4, even though this is the most common type of connection. It is however equally possible to connect a drain contact area to a buried rail in the exactly the same way. In the most general sense, any contact area of an active device can be connected to a buried rail by a lateral interconnect via, in accordance with the disclosed technology.

The disclosed technology is related to an integrated circuit chip including one or more active devices, such as transistors or diodes, which are connected to a buried rail in the manner described above.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. An integrated circuit chip including a front end of line portion that comprises:
    one or more buried interconnect rails; and
    at least one fin-based active device comprising a contact area in direct contact with a top portion of a semiconductor fin that is uniform with or built on a semiconductor substrate, the top portion of the semiconductor fin extending above a first dielectric layer present on the semiconductor substrate, the one or more buried interconnect rails being buried in the semiconductor substrate and in the first dielectric layer, and the one or more buried interconnect rails being located adjacent to the semiconductor fin, wherein the contact area is embedded in a further dielectric layer, hereafter referred to as the ILD0 layer, that is present on top of the first dielectric layer, and wherein the contact area is electrically connected to the one or more buried interconnect rails through an interconnect via that is in contact with the one or more buried interconnect rails and that extends at least partially above the one or more buried interconnect rails, wherein:
        an upper region of a sidewall of the interconnect via is in contact with a lateral portion of the contact area, thereby realizing the electrical connection between the interconnect via and the contact area, and
        the interconnect via is covered by the ILD0 layer.

2. The integrated circuit chip according to claim 1, wherein the contact area is a wrap-around contact area of which the sidewalls are essentially parallel to the central longitudinal plane of the semiconductor fin, and wherein the upper region of the sidewall of the interconnect via is essentially parallel to and in contact with a sidewall of the contact area.

3. The integrated circuit chip according to claim 1, wherein the sidewalls of the contact area are not parallel to the central longitudinal plane of the semiconductor fin.

4. A method of producing an electrical connection between a buried interconnect rail and a contact area of an integrated circuit chip including a front end of line portion that comprises one or more buried interconnect rails and at least one fin-based active device comprising the contact area in direct contact with a top portion of a semiconductor fin, that is uniform with or built on a semiconductor substrate, the top portion of the semiconductor fin extending above a first dielectric layer present on the substrate, the one or more buried interconnect rails being buried in the substrate and in the first dielectric layer, and the one or more buried interconnect rails being located adjacent to the semiconductor fin, the method comprising:
    providing the semiconductor fin, the first dielectric layer, the one or more buried interconnect rails, and the at least one fin-based active device including the contact area on the semiconductor substrate;
    depositing a layer of dielectric material, hereafter referred to as a partial ILD0 layer, on top of the first dielectric layer, and embedding the contact area in the partial ILD0 layer;
    producing a mask on top of the partial ILD0 layer, the mask having an opening at least partially overlapping the one or more buried interconnect rails and the contact area;
    anisotropically etching the material of the partial ILD0 layer and subsequently etching the material of the first dielectric layer in the location defined by the opening, the etch process being self-aligned relative to a lateral portion of the contact area, to thereby create a cavity, the etch process being continued at least until exposing at least the top surface of the one or more buried interconnect rails;
    in the cavity, providing an interconnect via formed above and in direct contact with the one or more buried interconnect rails, wherein an upper region of a sidewall of the interconnect via is in direct contact with a lateral portion of the contact area, thereby realizing the electrical connection between the interconnect via and the contact area;
    removing the mask; and
    depositing a further layer of dielectric material, covering the interconnect via and forming, together with the partial ILD0 layer, a final ILD0 layer.

5. The method according to claim 4, wherein the interconnect via is obtained in the cavity by:
    filling the cavity with an electrically conductive material; and
    performing a recess etch of the electrically conductive material in the cavity.

6. The method according to claim 4, wherein the contact area is a wrap-around contact area of which the sidewalls are essentially parallel to the central longitudinal plane of the semiconductor fin, and wherein the upper region of the sidewall of the interconnect via is essentially parallel to and in contact with a sidewall of the contact area.

7. The method according to claim 4, wherein the contact area has sidewalls which are not parallel to the central longitudinal plane of the semiconductor fin.

* * * * *